US00RE40748E

(19) United States
(12) Reissued Patent
Hasegawa et al.

(10) Patent Number: US RE40,748 E
(45) Date of Reissued Patent: Jun. 16, 2009

(54) PROCESS FOR PRODUCING SEMICONDUCTOR DEVICE

(75) Inventors: Toshiaki Hasegawa, Kanagawa (JP); Mitsuru Taguchi, Tokyo (JP); Koji Miyata, Kanagawa (JP)

(73) Assignee: Sony Corporation, Tokyo (JP)

(21) Appl. No.: 10/954,148

(22) Filed: Sep. 30, 2004

Related U.S. Patent Documents

Reissue of:
(64) Patent No.: 6,593,246
Issued: Jul. 15, 2003
Appl. No.: 09/525,265
Filed: Mar. 14, 2000

(30) Foreign Application Priority Data

Mar. 15, 1999 (JP) ..... 11-067783
May 27, 1999 (JP) ..... 11-147800
Dec. 9, 1999 (JP) ..... 11-349630

(51) Int. Cl.
*H01L 21/302* (2006.01)
*H01L 21/461* (2006.01)
*H01L 21/31* (2006.01)
*H01L 21/4763* (2006.01)

(52) U.S. Cl. ..... 438/736; 438/638; 438/778; 438/713

(58) Field of Classification Search ..... 438/736, 438/638, 778, 713
See application file for complete search history.

(56) References Cited

U.S. PATENT DOCUMENTS 3,607,267 A 9/1971 Garrels
5,110,712 A 5/1992 Kessler et al.
5,635,423 A 6/1997 Huang et al.
5,910,453 A 6/1999 Gupta et al.
5,960,304 A 9/1999 McAnally et al.
5,976,972 A 11/1999 Inohara et al.
6,037,268 A 3/2000 Dautartas et al.
6,077,769 A 6/2000 Huang et al.
6,103,632 A 8/2000 Kumar et al.
6,133,139 A 10/2000 Dalal et al.
6,140,226 A * 10/2000 Grill et al. ..... 438/637
6,146,989 A 11/2000 Okada
6,165,899 A 12/2000 Matumoto
6,204,168 B1 3/2001 Naik et al.
6,225,217 B1 5/2001 Usami et al.
6,261,949 B1 7/2001 Sukekawa
6,323,118 B1 * 11/2001 Shih et al. ..... 438/624

FOREIGN PATENT DOCUMENTS

JP 405121727 A * 5/1993
JP 405243217 A * 9/1993
JP 406112201 A * 4/1994
JP 406120215 A * 4/1994
JP 406120413 A * 4/1994

* cited by examiner

*Primary Examiner*—Chuong Anh Luu
(74) *Attorney, Agent, or Firm*—Rader, Fishman & Grauer PLLC; Ronald P. Kananen

(57) ABSTRACT

A process for producing a semiconductor device for forming a highly reliable wiring structure is provided that solves the problem occurring on using a xerogel or a fluorine resin in an inter level dielectric between the wirings to decrease a wiring capacitance, and the problem occurring on misalignment. A process for producing a semiconductor device comprising an inter level dielectric containing a xerogel film or a fluorine resin film comprises a step of forming, on the inter level dielectric comprising a lower layer of the inter level dielectric formed with an organic film and an upper layer of the inter level dielectric formed with a xerogel film or a fluorine resin film, a first mask to be an etching mask for forming a via contact hole by etching the inter level dielectric, and a step of forming, on the first mask, a second mask, which comprises a different material from the first mask, to be an etching mask for forming a wiring groove by etching the inter level dielectric.

11 Claims, 8 Drawing Sheets

PROCESS FOR PRODUCING SEMICONDUCTOR DEVICE

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a process for producing a semiconductor device, and more particularly, it relates to a process for producing a semiconductor device having a multi-layer wiring structure used for device process beyond the design rule of 0.25 μm.

2. Description of the Related Art

With the scale down of a semiconductor device, scale down of wiring and reduction of a wiring interval become necessary. Simultaneously, with the demand of low consuming electric power and high-speed operation, an inter level dielectric having a low dielectric constant and wiring having a low resistance become necessary. Particularly, in a logic device, because increase of the resistance and increase of the wiring capacitance due to the fine wiring bring about deterioration in operation speed, fine multi-layer wiring using a film having a low dielectric constant as an inter level dielectric becomes necessary.

In order to apply the dual damascene method to the inter level dielectric having a low dielectric constant, in which a conductive material is filled in a via hole and a wiring groove formed in the inter level dielectric, followed by flattening, it is necessary to employ a technique in which the via hole and the wiring groove can be simultaneously formed in the inter level dielectric having a low dielectric constant.

An organic polymer is receiving attention as the material for the inter level dielectric having a low dielectric constant. An organic polymer has a dielectric constant of about 2.7, which is lower than the conventional inter level dielectric using silicon oxide ($SiO_2$) having a dielectric constant of about 4.0 and silicon oxide fluoride (SiOF) having a dielectric constant of about 3.5. Therefore, a great improvement in performance is expected in a semiconductor device using an organic polymer in an inter level dielectric. However, as the organic polymer is an expensive material, taking the balance between increase in cost and improvement in performance of the semiconductor device into consideration, it has been studied a structure, in which only the inter level dielectric having groove wiring formed therein is formed with the organic polymer, and the inter level dielectric having a via hole formed therein is formed with silicon oxide or silicon oxide fluoride, which has been conventionally used. An example of such a structure will be described below with reference to FIGS. 1A to 1F.

As shown in FIG. 1A, a passivation film 111 comprising a material, into which a wiring material is not diffused, is formed with a silicon nitride film on a substrate 110, in which transistors and wiring have been formed, and then a first inter level dielectric 112, in which a via hole is to be formed, is formed with a silicon oxide film having a thickness of 500 nm. A resist mask (not shown in the figure) for forming a via hole is formed on the first inter level dielectric 112, and a via hole 113 is formed in the first inter level dielectric 112 by etching using the resist mask as an etching mask. The resist mask is then removed.

As shown in FIG. 1B, a second inter level dielectric 114, by which the via hole 113 is filled, is formed with an organic polymer having a thickness of 500 nm on the first inter level dielectric 112.

As shown in FIG. 1C, a mask layer 115 to be an etching mask for forming a wiring groove is formed with a silicon oxide film having a thickness of 100 nm on the second inter level dielectric 114. A resist mask 116 for forming a wiring groove pattern is formed on the mask layer 115. An opening 117 for forming the wiring groove pattern is formed in the resist mask 116.

As shown in FIG. 1D, the wiring groove pattern 118 is formed in the mask layer 115 by etching using the resist mask 116 as an etching mask.

As shown in FIG. 1E, the second inter level dielectric 114 is etched by using the resist mask 116 (see FIG. 1D) and the mask layer 115 as an etching mask to form a wiring groove 119, and the second inter level dielectric 114 filled in the via hole 113 is selectively removed to re-open the via hole 113 in the first inter level dielectric 112. Upon etching in this case, since the second inter level dielectric 114 comprising the organic polymer is etched, the resist mask 116 is simultaneously etched and removed. Therefore, a step of removing the resist mask 116 is not necessary.

Thereafter, as shown in FIG. 1F, the passivation film 111 exposed at the bottom of the via hole 113 is etched by using the first and second inter level dielectrics 112 and 114 as a mask. As a result, the wiring groove 119 and the via hole 113 having a dual damascene structure are formed.

The scale down of the wiring width and reduction of the interval bring about not only the aspect ratio of the wiring itself, but also the aspect ratio of the space among the wiring, and as a result, and thus difficulties are caused in the techniques for forming narrow and long wiring and the technique for filling a gap among fine wiring with an inter level dielectric. Thus, the process becomes complicated, and simultaneously the number of steps contained in the process is increased.

In a damascene process, in which after a via hole and a wiring groove are simultaneously filled with an aluminum series metal or a copper series metal by reflow sputtering, an excess metal on the inter level dielectric, in which the via hole and the wiring groove are formed, is removed by chemical mechanical polishing (hereinafter referred to as CMP), it is not necessary to form metallic wiring having a high aspect ratio by etching or to fill the gap among the wiring with an inter level dielectric, and thus the number of steps of the process can be greatly reduced. This process contributes to the reduction of the total cost in a greater extent when the aspect ratio of the wiring becomes larger, or the total number of the wiring becomes larger.

An inter layer dielectric having a low dielectric constant is applied to a device of a 0.18 μm or lower design role rule since it reduces the capacitance among the wiring. A film having a specific inductive capacity of 2.5 or less has a film property that is greatly different from a silicon oxide film used in the conventional device, and thus a process technique that can be applied to the film having a low dielectric constant is demanded.

Many of the films having a low dielectric constant of 3.0 or lower are organic films containing carbon, and they are employed instead of the conventional inter level dielectric. Oxygen is necessarily used on opening a via hole in the organic film used as the inter level dielectric. However since a resist comprising an organic film is used in the patterning technique used in the conventional process for producing a semiconductor device, there is a problem in that the film having a low dielectric constant is damaged in the step of removing the resist. Because the composition of the film having a low dielectric constant is similar to the composition of the resist, there is a possibility that the film having a low dielectric constant is removed in the step of removing the resist.

In recent years, an application of xerogel to a semiconductor device is receiving attention as a material expected to have a specific inductive capacity of 2.0 or less. The xerogel is a well-known material, for example, as silica gel used as a desiccating agent. The application of xerogel to a semiconductor device is difficult at present due to a demand of various kinds of reliability. That is, xerogel contains from 50 to 90% of pores by volume and thus has a problem in mechanical strength.

In the process described with reference to FIGS. 1A to 1F, the second inter level dielectric is filled in the via hole in the step shown in FIG. 1B. Therefore, in the step shown in FIG. 1E, because the second inter level dielectric in the via hole is etched until it is completely removed, over etching is often applied to the bottom of the wiring groove and the mask layer. As a result, the shoulder parts of the bottom of the wiring groove and the mask layer are cut by a sputtering phenomenon, and a wiring groove and a via hole having a good shape are difficult to be obtained. In the case where the interval of the wiring grooves is narrow, the wiring grooves adjacent to each other are connected due to the cutting of the shoulder parts of the mask layer, so as to cause a defect such as a short circuit.

In the process technique shown in FIGS. 1A to 1F, when the wiring groove is formed beyond. the via hole due to misalignment, the contact area of the via hole becomes small to cause problems, such as increase of the contact resistance, defective filling of the metal in the via hole, and deterioration of resistance to electro-migration. The misalignment will be described in detail below with reference to FIGS. 2A to 2F.

As similar to the case shown in FIGS. 1A and 1B, after forming a passivation film 111 on a substrate 110, a first inter level dielectric 112 is formed, and then a via hole 113 is formed in the first inter level dielectric 112, as shown in FIG. 2A. As shown in FIG. 2B, a second inter level dielectric 114 filling the via hole 113 is formed on the first inter level dielectric 112.

As shown in FIG. 2C, after forming a mask layer 115 on the second inter level dielectric 114, a resist mask 116 for forming a wiring groove pattern is formed on the mask layer 115. An opening 117 for forming the wiring groove pattern is formed in the resist mask 116. At this time, it is assumed that the opening 117 is formed deviating from the via hole 113 due to misalignment.

As shown in FIG. 2D, a wiring groove pattern 118 is formed in the mask layer 115 by etching using the resist mask 116 as an etching mask.

As shown in FIG. 2E, the second inter level dielectric 114 is etched by using the resist mask 116 (see FIG. 2D) and the mask layer 115 as an etching mask to form a wiring groove 119, and the second inter level dielectric 114 filled in the via hole 113 is selectively removed to re-open the via hole 113 in the first inter level dielectric 112. At this time, because the wiring groove 119 is formed deviating from the via hole 113 due to the misalignment, the second inter level dielectric 114 remains in a part of the via hole 113 to stuff up a part of the via hole 113, and thus the opening area is decreased.

As shown in FIG. 2F, the passivation film 111 exposed at the bottom of the via hole 113 is etched by using the first and second inter level dielectrics 112 and 114 as a mask. When the wiring groove 119 and the via hole 113 having a dual damascene structure are formed as described in the foregoing, because a part of the via hole 113 is stuffed up by the second inter level dielectric 114, the contact area becomes small to cause increase in contact resistance.

SUMMARY OF THE INVENTION

An object of the invention is to provide a process for producing a semiconductor device for solving the problems described in the foregoing.

The invention relates to a process for producing a semiconductor device comprising an inter level dielectric comprising a xerogel film or an organic film, the process comprising a step of forming, on an inter level dielectric, a first mask to be an etching mask for etching the inter level dielectric; and a step of forming, on the first mask, a second mask comprising a different material from the first mask to be an etching mask for etching the inter level dielectric.

Because the process for producing a semiconductor device of the invention comprises the step of forming, on an inter level dielectric, a first mask to be an etching mask for etching the inter level dielectric; and the step of forming, on the first mask, a second mask comprising a different material from the first mask to be an etching mask for etching the inter level dielectric, after the inter level dielectric is etched by using the first mask as an etching mask, the inter level dielectric can be etched by using the second mask as an etching mask to a pattern different from the first mask.

In the process for producing a semiconductor device, a lower layer of the inter level dielectric formed between wiring layers may be formed with an organic film, and an upper layer of the inter level dielectric formed between wiring of the same wiring layer may be formed with a xerogel film or an organic film.

In this embodiment of the production process, since the upper layer of the inter level dielectric formed between wiring of the same wiring layer is formed with a xerogel film or an organic film, such as a fluorine resin film, the dielectric constant between wiring of the same wiring layer, which becomes the maximum wiring capacitance, can be about from 1.8 to 2.4, and thus the wiring capacitance can be reduced.

Specifically, in a semiconductor device having the minimum interval of wiring, in particular, one of a design rule of 0.18 μm or less, a xerogel film or an organic film, such as a fluorine resin film, is applied to the part where the wiring interval is 0.3 μm or less. While the wiring capacitance is generally remarkably increased at the part where the wiring interval is 0.3 μm or less, an effect of decreasing the wiring capacitance can be obtained by using the xerogel film or the organic film, such as a fluorine resin film.

On the other hand, there is no large influence relating to the increase in capacitance at the part where the wiring interval is larger than 0.3 μm (for example, one between wiring layers vertically stacked). Therefore, it is sufficient to use an organic film having a specific inductive capacity of 3 or less at the part where the wiring interval exceeds 0.3 μm. A fluorine resin film may also be used as the organic film. As described in the foregoing, scale down of the wiring interval can be realized in the invention. Furthermore, by using a xerogel film or an organic film, such as a fluorine resin film, only between the wirings, and by using an organic film having a low dielectric constant of 3 or less for the other parts, the remarkable deterioration of the mechanical strength of the whole inter level dielectrics can be suppressed. In the case where the upper layer of the inter level dielectric is formed with an organic film, the lower layer of the inter level dielectric can be formed with an organic film, and the same function described in the foregoing can also be obtained in this case.

In the process for producing a semiconductor device of the invention, a pattern for forming the wiring groove may be formed in the second mask, and a pattern for forming the via hole is formed in the first mask in such a manner that the pattern for forming the via hole at least overlaps the pattern for forming the wiring groove. That is, the process for producing a semiconductor device may comprise, a step of forming, on the inter level dielectric, a first film for forming the first mask; a step of forming, on the first film, a second film for forming the second mask; a step of forming the second mask by forming a pattern or forming the wiring groove in the second film; and a step of forming the first mask by forming a pattern for forming the via hole in the first film is such a manner that the pattern for forming the via hole at least overlaps the pattern for forming the wiring groove.

In this embodiment of the production process, the resist process used for forming the first and second masks can be conducted under the condition in that the inter level dielectric is not exposed. That is, in the resist process for forming the second mask, the first film is formed as an underlayer, and in the resist process for forming the first mask, the first film itself covers the inter level dielectric. Thus, the restoration treatment of the resist process can be conducted.

Even when misalignment occurs on forming the pattern of the first mask for forming the via hole, the pattern for forming the via hole can also be formed in the second mask, and there is no possibility that the opening area of the via hole is reduced as described with reference to FIGS. 2A to 2F.

Furthermore, because the first mask and the second mask are formed with a material having light transmissibility, the so-called mask alignment, where the position of the mask is aligned to the underlayer upon exposure, can be conducted by an alignment method using light or an alignment method using an image processing.

DESCRIPTION OF PREFERRED EMBODIMENTS

A first embodiment of the process for producing a semiconductor device according to the invention will be described below with reference to the process diagram shown in FIGS. 3A to 3F, 4G and 4H.

Figure 1A:
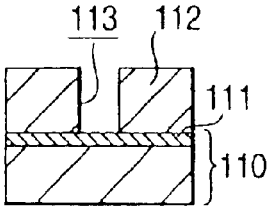
FIGS. 1A to 1F are cross sectional views showing a process diagram of a production process according to the conventional technique.
Figure 1B:
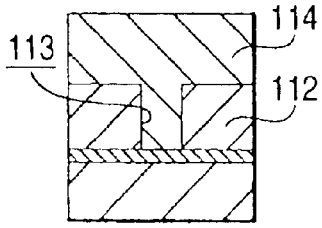
Figure 1C:
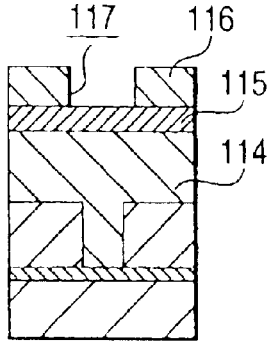
Figure 1D:
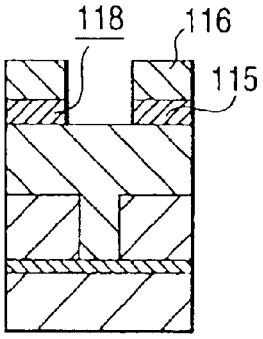
Figure 1E:
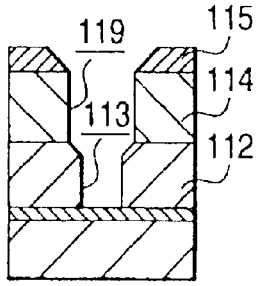
Figure 1F:
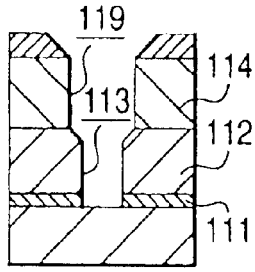
Figure 2A:
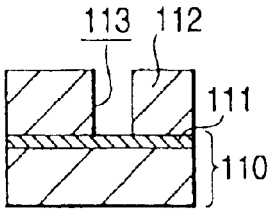
FIGS. 2A to 2F are cross sectional views showing a process diagram of a production process according to the conventional technique where misalignment occurs.
Figure 2B:
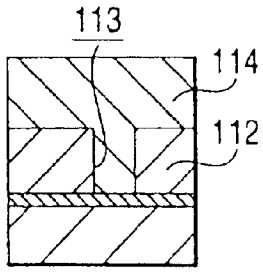
Figure 2C:
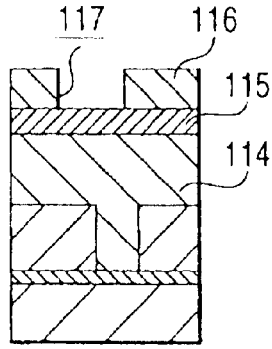
Figure 2D:
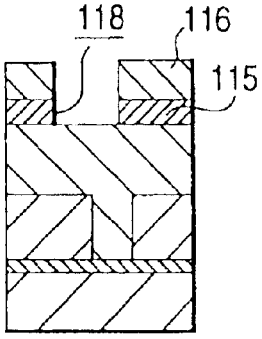
Figure 2E:
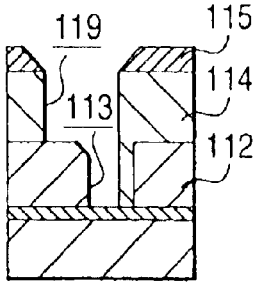
Figure 2F:
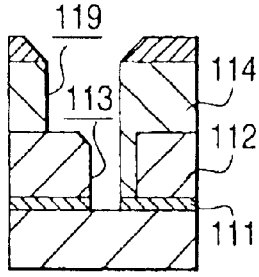
Figure 3A:
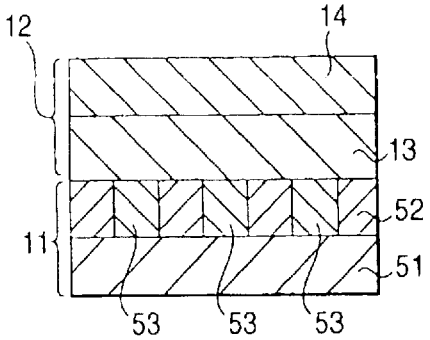
FIGS. 3A to 3F, 4G and 4H are cross sectional views showing a process diagram of a first embodiment of the process for producing a semiconductor device according to the invention.

As shown in FIG. 3A, an underlying substrate 11 comprises, for example, a substrate 51 having thereon transistors (not shown in the figure), and an inter metal dielectric 52 covering thereon, in which wiring 53 is formed. A first film having a low dielectric constant 13 to be a lower layer of an inter level dielectric 12 is formed on the underlying substrate 11 to a thickness of, for example, from 300 to 800 nm. The first film having a low dielectric constant 13 becomes an inter level dielectric (ILD) between wiring layers, and can be formed with an organic film having a specific inductive capacity of about 2.5. In this embodiment, an organic polymer totally called as polyaryl ether is employed. Specific examples of the polyaryl ether include flare (a tradename, produced by Aliedsignal Inc.), SILK (a trade name, produced by Dow Chemical Corp.) and VELOX (a trade name, produced by Schumacher Corp.). Alternatively, a BCB (bisbenzocyclobutene) film, a polyimide film and an amorphous carbon film may be used.

The formation of the organic polymer can be conducted, for example, by a precursor is coated as a film on the underlying substrate 11 by spin coating, and then cured at a temperature of from 300 to 450° C. In the case where the surface of the underlying substrate 11 is hydrophobic, and the adhesion to the organic film is poor, or in the case where diffusion of copper is prevented, while not shown in the figure, a silicon oxide film, a silicon oxide nitride film, a silicon carbide film or a titanium nitride silicate film is formed.

The silicon oxide film can be formed, for example, by the following manner. A commercially available SOG (spin on glass, for example, an SOG mainly comprising silanol, and an SOG mainly comprising a polymer containing silanol) is coated to a thickness of from 30 to 100 nm by a spin coating method. The coated film is baked at a temperature of from 150 to 200° C. for about 1 minute, and then cured at a temperature of from 350 to 450° C. for about from 30 to 60 minutes.

The silicon oxide film may be formed by a plasma CVD (chemical vapor deposition) method using a commercially available plasma CVD apparatus. In the case where the wiring 53 is copper wiring, it is not preferred to form the silicon oxide film by a normal plasma CVD method because the copper wiring is oxidized. However, the copper wiring can be prevented from oxidation as possible by using dinitrogen monoxide ($N_2O$) gas as the oxidizing agent, using a silane series gas (for example, monosilane ($SiH_4$), disilane ($Si_2H_6$) or trisilane ($Si_3H_8$)) as the silicon source, setting the substrate temperature to 300 to 400° C., setting the plasma power to 350 W, and the pressure of the film forming environment to about 1 kPa.

In the case of the silicon nitride oxide film, a commercially available inorganic SOG containing an amino group may be, for example, by formed into a film by a spin coating method. It is preferred that the film formation is conducted by the plasma CVD method. Examples of the gas used in the plasma CVD method include a silane series gas (monosilane ($SiH_4$), disilane ($Si_2H_6$) or trisilane ($Si_3H_8$)) as the silicon source, ammonia and hydrazine as the nitriding agent, and dinitrogen monoxide ($N_2O$) as the oxidizing agent. As the carrier gas, an inert gas, such as nitrogen, helium and argon, is employed. The film formation is conducted, for example, under such conditions that the substrate temperature is from 300 to 400° C., the plasma power is 350 W, and the pressure of the film forming environment is about 1 kPa.

In the case of the silicon nitride film, it can be formed by spin coating of a commercially available inorganic SOG containing an amino group as similar to the case of the silicon nitride oxide film. It is preferred that the film formation is conducted by the plasma CVD method. Examples of the gas used in the plasma CVD method include a silane series gas (monosilane ($SiH_4$)), disilane ($Si_2H_6$) or trisilane ($Si_3H_8$)) as the silicon source, ammonia and hydrazine as the nitriding agent, and dinitrogen monoxide ($N_2O$) as the oxidizing agent. As the carrier gas, an inert gas, such as nitrogen, helium and argon, is employed. The film formation is conducted, for example, under such conditions that the substrate temperature is from 300 to 400° C., the plasma power is 350 W, and the pressure of the film forming environment is about 1 kPa.

The silicon carbide film can be formed, for example, by using a parallel flat palate type plasma CVD apparatus. Examples of the gas used in the plasma CVD method include methyl silane as the silicon source. The film formation is conducted, for example, under such conditions that the substrate temperature is from 300 to 400° C., the plasma power is from 150 to 350 W, and the pressure of the film forming environment is about from 100 Pa to 1 kPa.

A second film having a low dielectric constant 14 to be an upper layer of the inter level dielectric 12 is formed to a thickness, for example, of 400 nm on the first film having a low dielectric constant 13. The second film having a low dielectric constant 14 is formed with a fluorine resin. Examples of the film include a fluorocarbon film, such as a cyclic fluorine resin, polytetrafluoroethylene (PTFE), amorphous PTFE (for example, Teflon AF, a trade name, produced by Du Pont Corp.), fluorinated aryl ether and fluorinated polyimide. Alternatively, a xerogel (for example, porous silica) may be employed.

The film of the fluorine resin can be formed by the manner, in which a precursor of the fluorine resin is coated on the first film having a low dielectric constant 13 by a spin coating apparatus, and then cured at a temperature of from 300 to 450° C. The materials, such as fluorinated amorphous carbon, can be formed by a plasma CVD method using acetylene ($C_2H_2$) and a fluorocarbon gas (for example, octafluorobutane ($C_4F_8$)) as the process gas. In this case, the film thus formed is cured at a temperature of from 300 to 450° C. The amorphous PTFE is not limited to Teflon AF and may be any substance having the structure represented by the following formula (1):

(1)

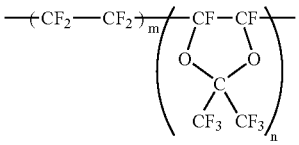

wherein m and n each represent a positive integer.

As the second film having a low dielectric constant 14, a cyclopolymerized fluorinated polymer series resin (for example, Cytop, a trade name) may be used. The cyclopolymerized fluorinated polymer series resin is not limited to Cytop and may be any substance having the structure represented by the following formula (2):

(2)

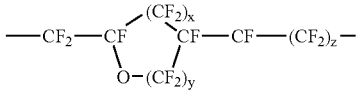

wherein x, y and z each represent a positive integer.

As the second film having a low dielectric constant 14, a fluorinated polyaryl ether series resin (for example, FLARE, a trade name) may be used. The fluorinated polyaryl ether series resin is not limited to FLARE and may be any substance having the structure represented by the following formula (3);

(3)

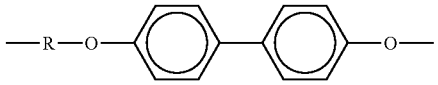

wherein R represents an alkyl group.

In the case where a xerogel is used as the second film having a low dielectric constant 14, Nanoporous Silica developed by Nanoglass LLC is formed into a film by using a spin coating apparatus developed by Nanoglass LLC. Nanoporous Silica is a kind of porous silica, and the xerogel that can be used in the invention is not limited to Nanoporous Silica. That is, any type of xerogels that can be formed by the following method can be used. A silanol resin having an alkyl group having a relatively high molecular weight, such as an aromatic group, is coated on a substrate and gelled, and the film is then subjected to a hydrophobic treatment by using a silane coupling agent or a hydrogenating treatment.

Figure 3B:
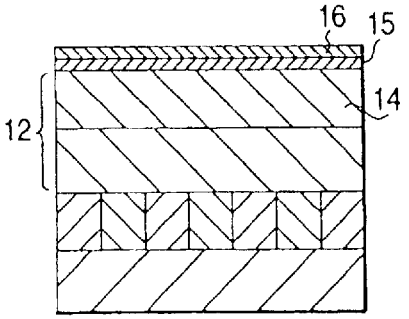

According to the manner described in the foregoing, the inter level dielectric 12 comprising the first film having a low dielectric constant 13 and the second film having a low dielectric constant 14 is formed on the underlying substrate As shown in FIG. 3B, a first film 15 for forming a first mask as an inorganic mask is formed with a silicon oxide film having a thickness of from 50 to 300 nm on the inter level dielectric 12, i.e., on the second film having a low dielectric constant 14. A second film 16 for forming a second mask is formed with a silicon nitride film having a thickness of from 50 to 150 nm. In the film forming method of these films, an ordinary CVD apparatus is used under the same conditions as described in the foregoing.

Before forming the silicon oxide film, it is preferred that a film having a larger silicon content than the silicon nitride film, the amorphous silicon nitride film, the silicon oxide film or the stoichiometric amount is formed, depending on necessity, particularly in the case where the oxidation of the second film having a low dielectric constant 15 causes a problem. That is, a CVD film is formed under a reductive atmosphere. The film thickness is preferably as thin as possible, and is generally about 10 nm. As described herein, the first film 15 is formed with a silicon oxide film that is excellent in light transmissibility in a wavelength range (for example, from 200 to 1,000 nm) used for alignment, and the second film 16 is also formed with a silicon nitride film having light transmissibility in a wavelength range (for example, from 200 to 1,000 nm) used for alignment.

As the inorganic mask, a metallic film or a metallic compound film, such as titanium, titanium nitride, tantalum and tantalum nitride, can be used, as well as the silicon nitride film. The film thickness thereof is preferably from 50 to 150 nm. The film formation thereof can be conducted by sputtering, which is generally employed in film formation of a metallic film and a metallic compound film.

Figure 3C:
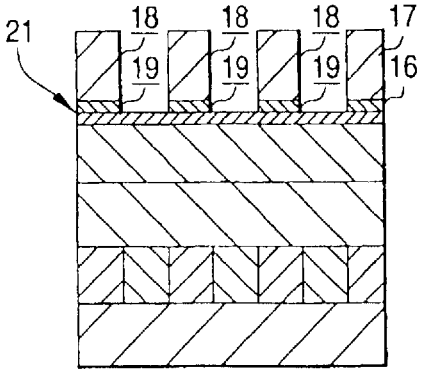

As shown in FIG. 3C, a resist film 17 is formed on the second film 16 by an ordinary resist coating technique (for example, a spin coating method). Thereafter, the resist film 17 is patterned by a lithography technique to form openings 18 for forming wiring grooves.

Subsequently, only the second film 16 is etched by using the resist film 17 as an etching mask to form openings 19 for forming wiring grooves, so as to form a second mask 21 to be an etching mask for forming wiring grooves in the inter level dielectric 12. In this step, only the second film 16 is selectively etched by using an ordinary magnetron type etching apparatus. As the etching conditions where the second film 16 comprises a silicon nitride film, for example, trifluoromethane ($CHF_3$) (5 $cm^3$/min), oxygen ($O_2$) (5 $cm^3$/min) and argon (Ar) (20 $cm^3$/min) are used as the etching gas, and an RF plasma is set at 600 W. In the case where the second film 16 comprises a metallic compound film, a chlorine series etching gas, such as boron chloride (BCl) and chlorine ($Cl_2$), is used as the etching gas. Thereafter, the resist film 17 is removed by ashing. FIG. 3C shows the state before removing the resist film 17.

Figure 3D:
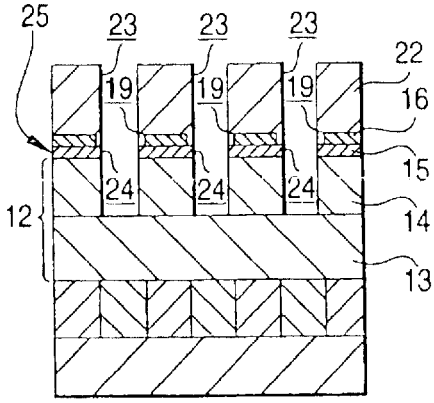

As shown in FIG. 3D, a resist film 22 is formed on the second film 16 and the first film 15 by an ordinary resist coating technique (for example, a spin coating method). Thereafter, the resist film 22 is patterned by a lithography technique to form openings 23 for forming via holes at positions within the openings 19 for forming the wiring grooves from the plan view of the second film 16.

Subsequently, only the first film 15 is etched by using the resist film 22 as an etching mask to form openings 24 for forming via holes in the inter level dielectric 12, so as to form a first mask 25 to be a etching mask for forming the via holes in the inter level dielectric 12.

The second film having a low dielectric constant 14 of the inter level dielectric 12 is etched by using an ordinary etching apparatus using the resist film 22 as an etching mask. As the etching conditions, for example, hexafluoroethane ($C_2F_6$) (14 $cm^3$/min), carbon monoxide (180 $cm^3$/min) and argon (240 $cm^3$/min) are used as an etching gas, and an RF plasma is set at 1.5 kw. Because the first film having a low dielectric constant 13 comprising an organic film is present as an underlayer of the second film having a low dielectric constant 14, the etching is stopped at the upper surface of the first film having a low dielectric constant 13.

Figure 3E:
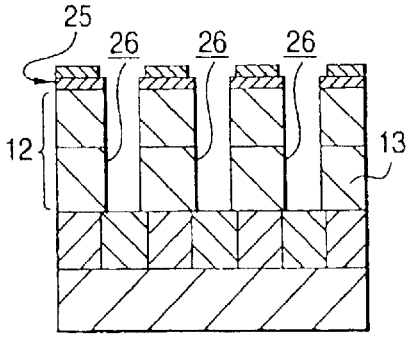

As shown in FIG. 3E, the first film having a low dielectric constant 13 is etched by using an ordinary etching apparatus using the first mask 25 as an etching mask, to form via holes 26 in the inter level dielectric 12. As an etching gas in the etching, nitrogen is used, and ammonia and a hydrogen gas are also used depending on necessity. At the time where the first film having a low dielectric constant 13 comprising an organic film is etched, the resist film 22 (see FIG. 3D) is also etched and completely removed. Therefore, there is no necessity to conduct resist ashing in this stage.

Figure 3F:
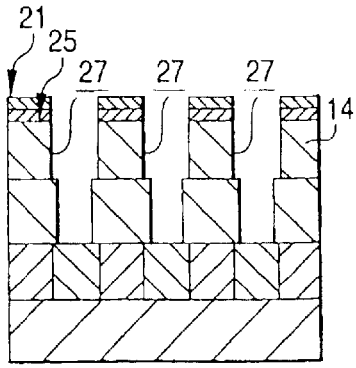

As shown in FIG. 3F, by using the second mask 21 comprising a silicon nitride film (or a metallic compound film), the first mask 25 is etched, and then the second film having a low dielectric constant 14 is etched, so as to form wiring grooves 27 in the second film having a low dielectric constant 14. The etching conditions of this step are the same as those for etching the second film having a low dielectric constant 14 described in the foregoing.

Figure 4G:
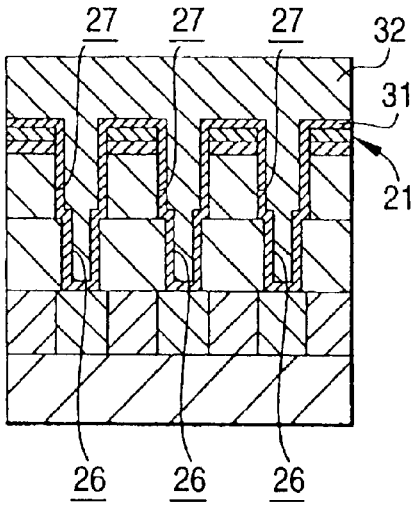

As shown in FIG. 4G, wiring is formed by a damascene method. A barrier metal layer 31 comprising tantalum nitride is formed on the inner walls of the wiring grooves 27 and the via holes 26 by sputtering or by a CVD method. At this time, the barrier metal layer 31 is also formed on the second mask 21. A wiring material (metal), such as copper, is accumulated by sputtering, a CVD method or an electrolytic plating method. In the case where the metal 32 is accumulated by an electrolytic plating method, a seed layer (not shown in the figure) comprising the same metal as the metal 32 to be accumulated is formed in advance.

Figure 4H:
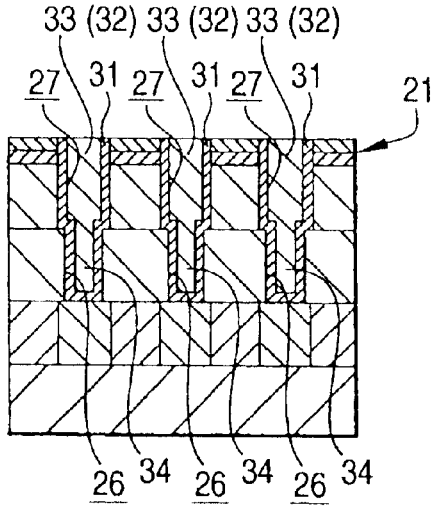

Thereafter, an excess metal 32 and the barrier metal layer 31 on the second mask 21 are removed by polishing using CMP, and, as shown in FIG. 4H, wiring 33 comprising the metal 32 is formed on the wiring grooves 27 via the barrier metal layer 31, so as to form plugs 34 comprising the metal 32 in the via holes 26 via the barrier metal layer 31. In this step, the second mask 21 functions as a polishing stopper, but in some cases, the second mask 21 may be completely removed depending on the thickness of the second mask 21. In this CMP, for example, an alumina slurry is employed.

While not shown in the figure, the process comprising from the step of forming the inter level dielectric 12 to the step of forming the wiring 33 and the plugs 34 may be repeated to form a multi-layer wiring. The inter metal dielectric 52 among the wiring 53 may be formed with a xerogel film or a fluorine resin film by the similar process as the foregoing.

In the descriptions in the foregoing, while an example is described, in which the inter level dielectric 12 is formed on the underlying substrate 11 having semiconductor elements formed therein, the production process can be applied to the case where the inter level dielectric 12, the via holes 26, the wiring grooves 27, the wiring 33 and the plugs 34 having the constitution described above are formed on a substrate having no semiconductor element.

The process for producing a semiconductor device described in the foregoing comprises a step of forming, on the inter level dielectric 12, the first mask 25 to be an etching mask for etching the inter level dielectric 12, and a step of forming, on the first mask 25, the second mask 21 to bean etching mask for etching the inter level dielectric 12, the second mask 21 comprising a material different from the first mask 25. Therefore, the inter level dielectric 12 is etched by using the first mask 25 as an etching mask to form the via holes 26, and then the upper layer of the inter level dielectric 12, i.e., the second film having a low dielectric constant 14, is etched by using the second mask 21 as an etching mask to a pattern for forming wiring grooves different from the first mask 25, to form the wiring grooves 27.

Furthermore, because the upper layer of the inter metal dielectric between the wirings in the same wiring layer, i.e., the second film having a low dielectric constant 14, is formed with a xerogel film or a fluorine resin film, the dielectric constant between the wirings in the same wiring layer where the wiring capacity becomes maximum is about from 1.8 to 2.4, and thus the wiring capacitance is reduced. Specifically, in a semiconductor device having the minimum interval of wiring, in particular, one of a design rule of 0.18 μm or less, a xerogel film or a fluorine resin film is applied to the part where the wiring interval is 0.3 μm or less. While the wiring capacitance is generally remarkably increased at the part where the wiring interval is 0.3 μm or less, an effect of decreasing the wiring capacitance can be obtained by using the xerogel film or the fluorine resin film.

On the other hand, there is no large influence relating to the increase in capacitance at the part where the wiring interval is larger than 0.3 μm (for example, one between the wirings 53 and the wiring 33) Therefore, it is sufficient to use an organic film having a specific inductive capacity of 3 or less at the part where the wiring interval excess 0.3 μm. As described in the foregoing, scale down of the wiring interval can be realized in the invention. Furthermore, by using a xerogel film or a fluorine resin film only between the wirings, and by using an organic film having a low dielectric constant for the other parts, the remarkable deterioration of the mechanical strength of the whole inter level dielectrics can be suppressed.

Furthermore, the resist process (a step of patterning the resist film) for forming the first and second masks 25 and 21 can be conducted under the condition where the inter level dielectric 12 is not exposed. That is, in the resist process for forming the second mask 21, the first film 15 is formed as an underlayer, and in the resist process for forming the first mask 25, the first film 15 itself covers the inter level dielectric 12. Thus, without exposing the inter level dielectric 12 comprising an organic film, the resist films 17 and 22 formed by the resist process can be removed, and a restoration treatment of the resist where the resist films 17 and 22 are again formed and patterned can be conducted. Furthermore, because the resist film 22 to be an etching mask for forming the first mask can be removed simultaneously to the etching of the first film having a low dielectric constant 13, the operation of removing the resist film 22 by ashing is not necessary. Therefore, the process can be simplified.

In the resist process where the openings 24 to be a pattern for forming the via holes are formed in the first mask 25, i.e., in the process for forming the openings 23 in the resist film 22, even when misalignment occurs to form the openings 23 formed in the resist film 22 deviating from the openings 19 to be a pattern for forming the wiring grooves, because openings (not shown in the figure) to be a pattern for forming the via holes can be formed in the second mask 21, a via holes having a narrowed opening area is not formed as described with reference to FIGS. 2A to 2F.

Furthermore, when the first film 15 to be the first mask 25 is formed with a material having light transmissibility, for example, a silicon oxide film used herein, and the second film 16 to be the second mask is formed with a material having light transmissibility, for example, a silicon nitride film used herein, the mask alignment, where the position of the mask is aligned to the underlayer in an exposure step, can be conducted by an ordinary alignment method using light or an alignment method using an image processing. It has been known that a silicon oxide film and a silicon nitride film transmit light in the wavelength region of from 200 to 1,000 nm used for alignment.

Moreover, an etching stopper layer having a high dielectric constant (for example, a silicon nitride film, a silicon oxide film or a silicon oxide nitride film), which has been conveniently used, is not necessary by utilizing the difference in characteristics of the materials. For example, when the conditions for etching the second film having a low dielectric constant 14 (a xerogel film or a fluorine resin film) are selected in such a manner that the first film having a low dielectric constant 13 (an organic film) is not etched, the wiring grooves 27 can be formed in the second film having a low dielectric constant 14 to be a wiring layer with good controllability. When the etching for forming the via holes 26 is conducted, the second film having a low dielectric constant 14 comprising a xerogel or a fluorine resin is etched, and simultaneously the first film having a low dielectric constant 13 comprising an organic film is etched.

Figure 5A:
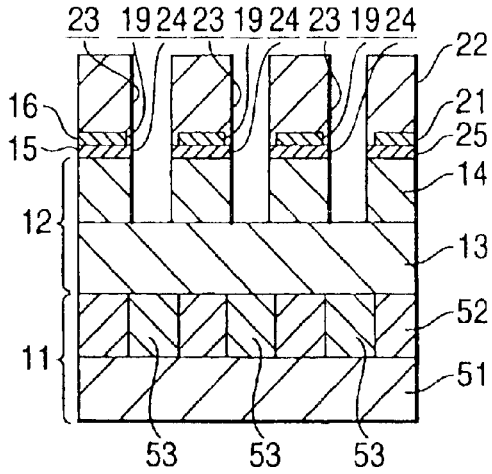
FIGS. 5A to 5C are cross sectional views showing a process diagram of a second embodiment of the process for producing a semiconductor device according to the invention.
Figure 5B:
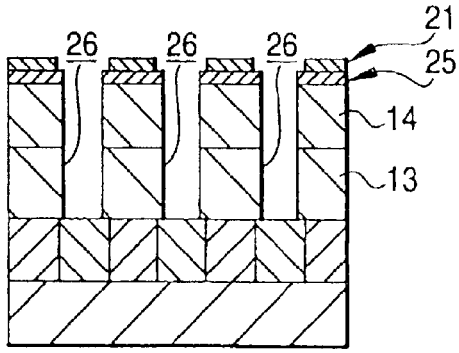
Figure 5C:
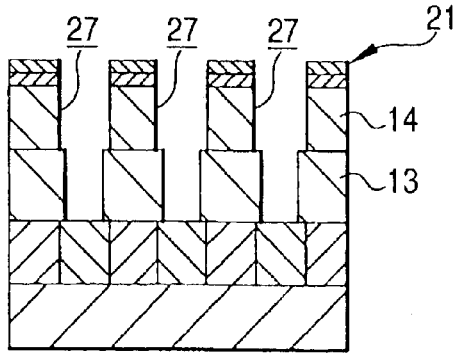

A second embodiment of the process for producing a semiconductor device according to the invention will be described below with reference to the process diagram shown in FIGS. 5A to 5C. In FIGS. 5A to 5C, the same symbols are attached to the same constitutional components as in FIGS. 3A to 3F, 4G and 4H.

As shown in FIG. 5A, an underlying substrate 11 comprises, for example, a substrate 51 having thereon transistors (not shown in the figure), and an inter metal dielectric 52 covering thereon, in which wiring 53 is formed. A first film having a low dielectric constant 13 to be a lower layer of an inter level dielectric 12 on the underlying substrate 11 is formed, for example, with an inorganic film having a thickness of from 300 to 800 nm.

A second film having a low dielectric constant 14 to be an upper layer of the inter level dielectric 12 is formed to a thickness, for example, of 400 nm on the first film having a low dielectric constant 13. The second film having a low dielectric constant 14 is formed with a fluorine resin. As the fluorine resin, the materials described for the first embodiment can be employed.

The inter level dielectric 12 comprising the first film having a low dielectric constant 13 and the second film having a low dielectric constant 14 is thus formed on the underlying substrate 11.

A first film 15 for forming a first mask as an inorganic mask is formed with a silicon oxide film having a thickness of from 50 to 300 nm on the inter level dielectric 12, i.e., on the second film having a low dielectric constant 14. A second film 16 for forming a second mask is formed with a silicon nitride film having a thickness of from 50 to 150 nm. The film forming method of these films is the same as those described for the first embodiment.

According to the same manner as described with reference to FIG. 3C, only the second film 16 is etched to form openings 19 for forming wiring grooves, so as to form a second mask 21 to be an etching mask for forming the wiring grooves in the inter level dielectric 12.

A resist film 22 is formed on the second film 16 and the first film 15 by an ordinary resist coating technique (for example, a spin coating method). Thereafter, the resist film 22 is patterned by a lithography technique to form openings 23 for forming via holes at positions within the openings 19 for forming the wiring grooves from the plan view of the second film 16.

Subsequently, only the first film 15 is etched by using the resist film 22 as an etching mask to form openings 24 for forming via holes in the inter level dielectric 12, so as to form a first mask 25 to be an etching mask for forming the via holes in the inter level dielectric 12.

The second film having a low dielectric constant 14 of the inter level dielectric 12 is etched by using an ordinary etching apparatus using the first mask 25 as an etching mask. As the etching conditions, for example, nitrogen ($N_2$) (48 $cm^3$/min) and helium (He) (200 $cm^3$/min) are used as an etching gas, a microwave power is set at 1.35 kW (2.45 GHz), an RF plasma is set at 150 W, and a substrate temperature is set at −50° C. Because the resist film 22 is etched and completely removed in this etching step, removal of the resist is not necessarily conducted. Furthermore, because the first film having a low dielectric constant 13 comprising an inorganic film is present as an underlayer of the second film having a low dielectric constant 14, the etching is stopped at the upper surface of the first film having a low dielectric constant 13.

As shown in FIG. 5B, the first mask 25 is then etched by using the second mask 21 comprising a silicon nitride film (or a metallic compound film). In this step, because the second film having a low dielectric constant 14 is formed with an organic film, the first film having a low dielectric constant 13 comprising an inorganic film is etched with the second film having a low dielectric constant 14 as an etching mask, so as to form via holes 26. In this etching step, octafluorobutane ($C_4F_8$) and carbon monoxide (CO), for example, are used as an etching gas.

As shown in FIG. 5C, the second film having a low dielectric constant 14 is etched by using the second mask 21 as an etching mask to form wiring grooves 27. The etching conditions in this step are the same as the conditions for etching the second film having a low dielectric constant 14. In this etching step, since the first film having a low dielectric constant 13 comprises an inorganic film, the etching is stopped at the upper surface of the first film having a low dielectric constant 13.

While not shown in the figure, wiring is formed in the wiring grooves 27 via a barrier metal layer, and plugs are formed in the via holes 26 via the barrier metal layer, in the same manner as described with reference to FIGS. 4G and 4H for the first embodiment.

In the second embodiment, as similar to the first embodiment, the process comprising from the step of forming the inter level dielectric 12 to the step of forming the wiring and the plugs may be repeated to form a multi-layer wiring. The inter metal dielectric 52 among the wiring 53 may be formed with an organic film, such as a xerogel film or a fluorine resin film, by the similar process as the foregoing.

In the descriptions in the foregoing, while an example is described, in which the inter level dielectric 12 is formed on the underlayer substrate 11 having semiconductor elements formed therein, the production process can be applied to the case where the inter level dielectric 12, the via holes 26, the wiring grooves 27, the wiring 33 and the plugs 34 having the constitution described above are formed on a substrate having no semiconductor element.

According to the second embodiment of the process for producing a semiconductor device of the invention, the same function and effect as the first embodiment of the process for producing a semiconductor device can be obtained.

A third embodiment of the process for producing a semiconductor device according to the invention will be described below with reference to the process diagram shown in FIGS. 6A to 6F. In FIGS. 6A to 6F, the same symbols are attached to the same constitutional components as in FIGS. 3A to 3F.

Figure 6A:
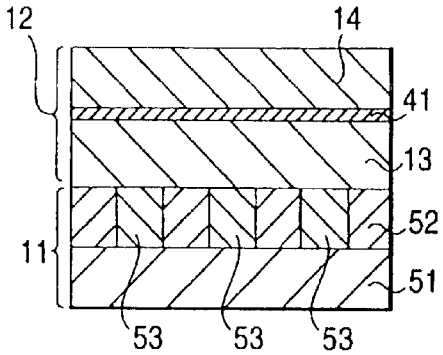
FIGS. 6A to 6F are cross sectional views showing a process diagram of a third embodiment of the process for producing a semiconductor device according to the invention.

As shown in FIG. 6A, an underlying substrater 11 comprises, for example, a substrate 51 having thereon transistors (not shown in the figure), and an inter metal dielectric 52 covering thereon, in which wiring 53 is formed. A first film having a low dielectric constant 13 to be a lower layer of an inter level dielectric 12 is formed to a thickness of, for example, from 300 to 800 nm on the underlying substrate 11. The first film having a low dielectric constant 13 becomes an inter level dielectric (ILD) between wiring layers, and can be formed with an organic film having a specific inductive capacity of about 2.5. For example, it can be formed with the same material as described for the first embodiment in the same film forming method as described therefor.

An intermediate film 41 to be an etching mask is formed with, for example, a silicon oxide film on the first film having a low dielectric constant 13. The method for forming the same may be the same forming method of the silicon oxide film as described for the first embodiment.

A second film having a low dielectric constant 14 to be an upper layer of the inter level dielectric 12 is formed to a thickness, for example of 400 nm on the intermediate film 41. The second film having a low dielectric constant 14 is formed with a fluorine resin. Examples of the film include a fluorocarbon film, such as a cyclic fluorine resin, polytetrafluoroethylene (PTFE), amorphous PTFE (for example, Teflon AF, a trade name, produced by Du Pont Corp.), fluorinated aryl ether and fluorinated polyimide. Alternatively, a xerogel (for example, porous silica) may be employed. The method for forming the fluorine resin film may be the same forming method as described for the first embodiment. Alternatively, the second film having a low dielectric constant 14 is formed with a xerogel film. The method for forming the xerogel film may be the same forming method as described for the first embodiment.

According to the manner described in the foregoing, the inter level dielectric 12 comprising the first film having a low dielectric constant 13, the intermediate film 41 and the second film having a low dielectric constant 14 is formed on the underlying substrate 11.

Figure 6D:
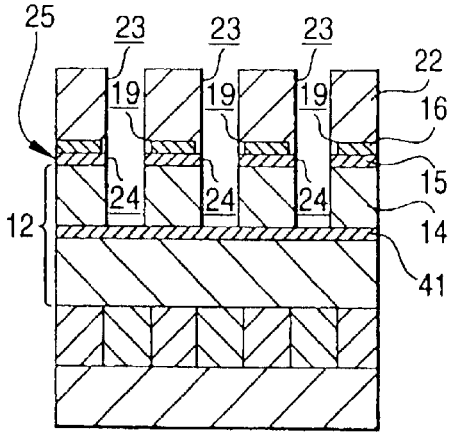
Figure 6B:
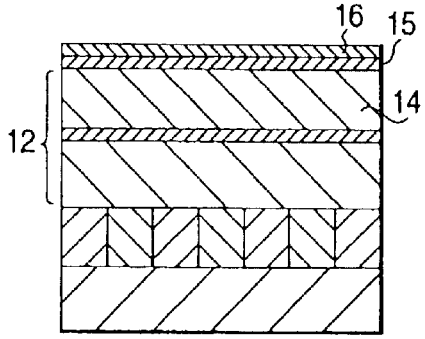

As shown in FIG. 6B, a first film 15 for forming a first mask as an inorganic mask is formed with a silicon oxide film having a thickness of from 50 to 300 nm on the inter level dielectric 12, i.e., on the second film having a low dielectric constant 14. A second film 16 for forming a second mask is formed with a silicon nitride film having a thickness of from 50 to 150 nm. The film forming method of these films may be the same forming method as described for the first embodiment.

Before forming the silicon oxide film, it is preferred that a film having a larger silicon content than the silicon nitride film, the amorphous silicon, the silicon nitride oxide film or the stoichiometric amount is formed, depending on necessity, particularly in the case where the oxidation of the second film having a low dielectric constant 15 causes a problem. That is, a CVD film is formed under a reductive atmosphere. The film thickness is preferably as thin as possible, and is generally about 10 nm. As described herein, the first film 15 is formed with a silicon oxide film that is excellent in light transmissibility in a wavelength range (for example, from 200 to 1,000 nm) used for alignment, and the second film 16 is also formed with a silicon nitride film having light transmissibility in a wavelength range (for example, from 200 to 1,000 nm) used for alignment.

Figure 6E:
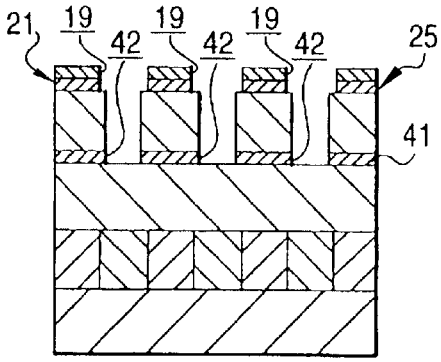
Figure 6C:
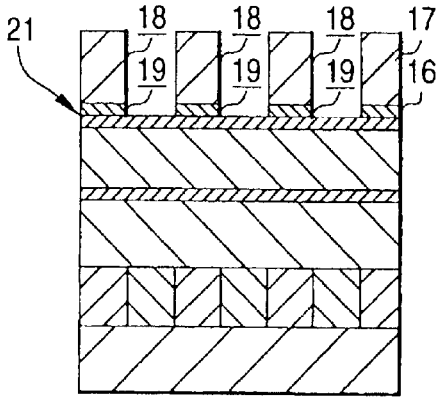

As shown in FIG. 6C, a resist film 17 is formed on the second film 16 by an ordinary resist coating technique (for example, a spin coating method). Thereafter, the resist film 17 is patterned by a lithography technique to form openings 18 for forming wiring grooves.

Subsequently, the second film 16 is etched by using the resist film 17 as an etching mask to form openings 19 for forming wiring grooves, so as to form a second mask 21 to be an etching mask for forming wiring grooves in the inter level dielectric 12. The etching step may be conducted in the same manner as for the first embodiment. Thereafter, the resist film 17 is removed by ashing. FIG. 6C shows the state before removing the resist film 17.

As shown in FIG. 6D, a resist film 22 is formed on the second film 16 and the first film 15 by an ordinary resist coating technique (for example, a spin coating method). Thereafter, the resist film 22 is patterned by a lithography technique to form openings 23 for forming via holes at positions within the openings 19 for forming the wiring grooves from the plan view of the second film 16. Even when deviation occurs on aligning the masks, it is necessary that at least a part of the opening 23 overlaps the opening 19.

Subsequently, only the first film 15 is etched by using the resist film 22 as an etching mask to form openings 24 for forming via holes in the inter level dielectric 12, so as to form a first mask 25 to be an etching mask for forming the via holes in the inter level dielectric 12.

The second film having a low dielectric constant 14 of the inter level dielectric 12 is etched by using an ordinary etching apparatus using the first mask 25 as an etching mask. As the etching conditions, for example, nitrogen is used as an etching gas, and ammonia and a hydrogen gas may also be used depending on necessity. In this etching step, a fluorine carbide series gas and carbon monoxide are not necessary. Because the intermediate film 41 comprising a silicon oxide film is present as an underlayer of the second film having a low dielectric constant 14, the etching is stopped at the intermediate film 41. In the etching step, the resist film 22 is etched and completely removed when the second film having a low dielectric constant 14 comprising an organic film is etched. Therefore, there is no necessity to conduct resist ashing in this stage.

As shown in FIG. 6E, the first mask 25 and the intermediate film 41 are etched by using an ordinary etching apparatus using the second mask 21 and the second film having a low dielectric constant 14 as an etching mask. That is, the first mask 25 is etched as transferring the openings 19 formed in the second mask 21 for forming the wiring grooves, and openings 42 for forming via holes in the intermediate film 41 are formed by etching. As the etching conditions, for example, octafluorobutane ($C_4F_8$) (5 $cm^3$/min), carbon monoxide (5 $cm^3$/min) and argon (20 $cm^3$/min) are used as an etching gas, and an RF plasma is set at 600 W.

Figure 6F:
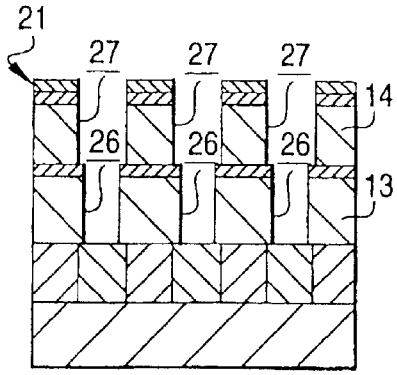

As shown in FIG. 6F, by using the first mask 25 (the second mask 21) and the intermediate film 41 as an etching mask, the second film having a low dielectric constant 14 and the first film having a low dielectric constant 13 are etched, to form wiring grooves 27 in the second film having a low dielectric constant 14, and simultaneously to form via holes 26 in the first film having a low dielectric constant 13. As the etching gas in this etching step, nitrogen ($N_2$) is used, and ammonia and a hydrogen gas may also be used depending on necessity.

While not shown in the figure, wiring comprising metal is formed in the wiring grooves 27 via a barrier signal metal layer, and plugs comprising metal are formed in the via holes 26 via the barrier metal layer, in the same manner as described with reference to FIGS. 4G and 4H.

According to the third embodiment described with reference to FIGS. 6A to 6F, the same function and effect as the first embodiment described with reference to FIGS. 3A to 3F can be obtained.

The intermediate film 41 may also be formed with a silicon nitride oxide film or a silicon nitride film. Alternatively, it may be formed with an organic film that becomes an etching mask with respect to the first film having a low dielectric constant 13 and becomes an etching stopper with respect to the second film having a low dielectric constant 14.

The xerogel film, the fluorine resin film and the other organic films are being employed in the wiring structure for the object of suppressing the wiring capacitance increasing with the scale down. In this case, the organic film may be employed as a material having a specific inductive capacitance of 3 or less, the fluorine resin may be employed as an organic film material having a specific inductive capacitance of 2.5 or less, and the xerogel film, which is a gel having a network structure containing no water, may be employed as a material having a specific inductive capacitance of 2.5 or less.

Among the xerogels described in the foregoing, a film that can be used in a semiconductor device includes a silica series gel. For example, Nanoporous Silica produced by Nanoglass LLC can be used. However, the xerogel film of this type is inferior in mechanical strength, heat conductivity, heat resistance, water resistance and adhesiveness in comparison to the conventional inter level dielectric. In particular, the heat conductivity is remarkably poor as is from 1/10 to 1/100 of the organic film.

On the other hand, as the fluorine resin, commercial products, such as a film formed by plasma CVD (reported by NEC Corp. in IEDM (International Electron Devices Meeting) on 1997), Teflon (produced by Du Pont Corp.) and fluorinated polyimide (produced by Du Pont Corp.) have been developed. As those under development, there are a vapor deposition film of fluorinated Parylene and a copolymer of a fluorine resin and silica. However, these films are inferior in mechanical strength, heat conductivity, heat resistance and adhesiveness in comparison to the organic polymer having a specific inductive capacity of 2.5 or more.

Under the circumstances, the invention employs a combination of a xerogel film and an organic film having a better film property than the xerogel film, or a combination of a fluorine resin film and an organic film having a better film property than the fluorine resin film, as described in the embodiments above, so as to realize to form a highly reliable wiring structure.

That is, the xerogel film or the fluorine resin film is used only in the part between the wirings, at which the wiring capacitance is increased by the scale down, and the other parts are formed with the organic film or the inorganic film having a low dielectric constant. Specifically, in a semiconductor device having the minimum interval of wiring, in particular, one of a design rule of 0.18 μm or less, the xerogel film or the fluorine resin film is applied to the part where the wiring interval is 0.3 μm or less because the wiring capacity is remarkably increased at the part where the wiring interval is 0.3 μm or less. According to this, an effect of decreasing the wiring capacitance can be obtained. On the other hand, there is no large influence at the part where the wiring interval is larger than 0.3 μm (for example, one between wiring layers vertically stacked). Therefore, it is sufficient to use an organic film having a specific inductive capacity of 3 or less at the part where the wiring interval exceeds 0.3 μm.

A fourth embodiment of the process for producing a semiconductor device according to the invention will be described below with reference to the process diagram shown in FIGS. 7A to 7I.

Figure 7A:
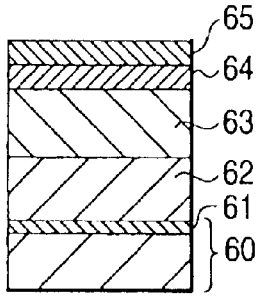
FIGS. 7A to 7I are cross sectional views showing a process diagram of a fourth embodiment of the process for producing a semiconductor device according to the invention.

As shown in FIG. 7A, a substrate 60 is constituted, for example, by forming a semiconductor element, such as a transistor, on a semiconductor substrate, and then forming wiring and dielectrics. A passivation film 61 is formed with a material, by which the wiring material is not diffused, such as a silicon nitride film, having a thickness of about 50 nm on the uppermost layer of the substrate 60.

Thereafter, a first inter level dielectric 62, in which a via hole is formed, is formed with a silicon oxide series material, such as a silicon oxide ($SiO_2$) film (an inorganic film) having a thickness of 500 nm, and then a second inter level dielectric 63, in which wiring is formed, is formed with an organic material, such as a polyaryl ether film having a thickness of 500 nm. Subsequently, a first film 64 for forming a first mask is formed with a silicon oxide film having a thickness of 100 nm, and then a second film 65 for forming a second mask is formed with a silicon nitride film having a thickness of 100 nm.

Figure 7B:
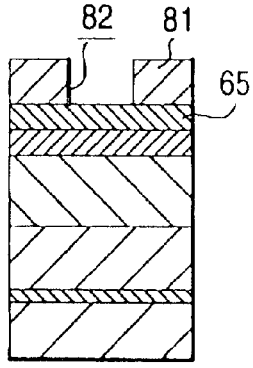

As shown in FIG. 7B, a resist mask 81 for forming a wiring groove is formed on the second film 65 by conducting an ordinary resist coating process and an ordinary lithography process. In the resist mask 81, an opening 82 for forming the wiring groove is formed.

Figure 7C:
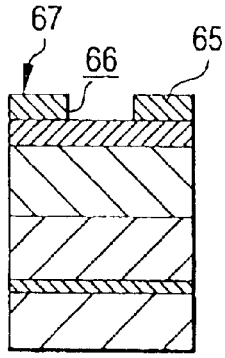

Subsequently, as shown in FIG. 7C, the first film 65 is etched by using the resist mask 81 (see FIG. 7B) to open a wiring groove pattern 66 for forming the wiring groove, so as to form a second mask 67. In this etching step, an ordinary parallel flat palate type plasma etching apparatus is used, and trifluoromethane ($CHF_3$), argon (Ar) and oxygen ($O_2$) are used as an etching gas. The substrate temperature is 0° C. Thereafter, the resist mask 81 (see FIG. 7B) is removed.

Figure 7D:
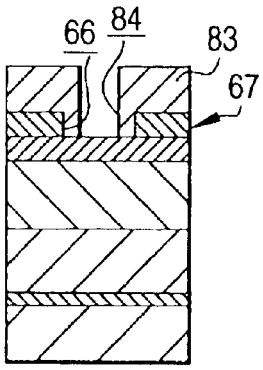

As shown in FIG. 7D, a resist mask 83 used for forming a via hole is formed on the second mask 67 and the wiring groove pattern 66 by again conducting an ordinary resist coating process and an ordinary lithography process. In the resist mask 83, an opening 84 for forming the via hole is formed in such a manner that it at least overlaps the wiring groove pattern 66.

Figure 7E:
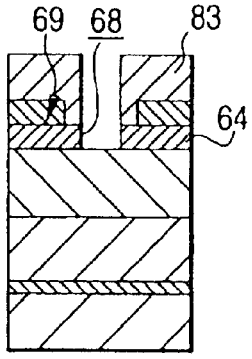

As shown in FIG. 7E, the first film 64 is etched by using the resist mask 83 as an etching mask to form a via hole pattern 68 for forming the via hole, so as to form a first mask 69. In etching of the first film 64, an ordinary parallel flat palate type plasma etching apparatus is used, and octafluorobutane ($C_4F_8$), argon (Ar) and oxygen ($O_2$) are used as an etching gas. The substrate temperature is 0° C.

Figure 7F:
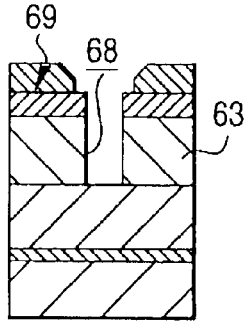

As shown in FIG. 7F, the second inter level dielectric 63 is etched by using the first mask 69 as an etching mask to extend the via hole pattern 68. In this etching step, the resist mask 83 is simultaneously etched and removed. In the etching step of the second inter level dielectric 63, an ordinary high-density plasma etching apparatus, and ammonia ($NH_3$) is used as an etching gas. The substrate temperature is −20° C.

Figure 7G:
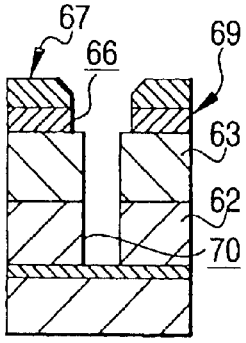

Subsequently, as shown in FIG. 7G, the wiring groove pattern 66 is extended to the first mask 69 by using the second mask 67 as an etching mask. At the same time, the first inter level dielectric 62 is etched by using the second inter level dielectric 63 as an etching mask to form a via hole 70. In this etching step, an ordinary parallel flat palate type plasma etching apparatus is used, and octafluorobutane ($C_4F_8$), argon (Ar) and oxygen ($O_2$) are used as an etching gas. The substrate temperature is set at 0° C.

Figure 7H:
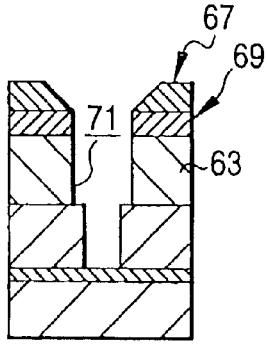

As shown in FIG. 7H, the second inter level dielectric 63 is etched by using the first mask 69 as an etching mask to form a wiring groove 71. In the etching step, an ordinary high-density plasma etching apparatus, and ammonia ($NH_3$) is used as an etching gas. The substrate temperature is −100° C.

Figure 7I:
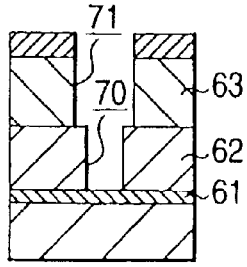

Thereafter, as shown in FIG. 7I, the passivation film 61 exposed at the bottom of the via hole 70 is etched. At this time, the second mask 67 (see FIG. 7H) comprising the same material as the passivation film is also etched and removed. In this etching step, in order to selectively conduct anisotropic etching of the silicon nitride film, an ordinary high-density plasma etching apparatus is used, and sulfur hexafluoride ($SF_6$) is used as an etching gas. The substrate temperature is 0° C. As a result, the wiring groove 71 is formed in the second inter level dielectric 63, and the via hole 70 is formed in the first inter level dielectric 62 and the passivation film 61 as being connected to the bottom of the wiring groove 71.

While a silicon oxide ($SiO_2$) film is used as the first inter level dielectric 62 in this embodiment, silicon oxide fluoride (SiOF), for example, may also be used.

While the second mask layer 65 is formed with a silicon nitride film, it may be formed with a high melting point metal film or a high melting point metal compound film, such as a titanium nitride film. That is, any material may be used as far as the material has etching selectivity to the silicon oxide series material. It is preferred to use a film having light transmissibility, by which optical alignment can be conducted.

In the fourth embodiment described with reference to FIGS. 7A to 7I, while an example is described, in which the first and second inter level dielectrics 62 and 63 are formed on the substrate 60 having semiconductor elements formed therein, the production process described with reference to 7A to 7I can be applied to the case where the first and second inter level dielectrics 62 and 63, the via hole 70 and the wiring groove 71 are formed on a substrate having no semiconductor element.

The fourth embodiment of the process for producing a semiconductor device comprises a step of forming, on the second inter level dielectric 63, the first mask 69 to be an etching mask for etching the first and second inter level dielectrics 62 and 63, and a step of forming, on the first mask 69, the second mask 67, which comprises a material different from the first mask 69, to be an etching mask for etching the second inter level dielectric 63. Therefore, it is possible that the first and second inter level dielectrics 62 and 63 are etched by using the first mask 69 as an etching mask to form the via hole 70, and then the second inter level dielectric 63 is etched by using the second mask 67 having the wiring groove pattern 66, which is different from the first mask 69, as an etching mask to form the wiring groove 71.

Because the second inter level dielectric 63, which becomes an inter level dielectric between wiring in the same wiring layer, is formed with a polyaryl ether film, which is an organic polymer film, the dielectric constant between the wirings is decreased in comparison to the case where the second inter level dielectric 63 is formed with a silicon oxide series material, and thus the wiring capacitance is also decreased in comparison to the case where the second inter level dielectric 63 is formed with a silicon oxide series material.

Furthermore, the resist process (a step of patterning a resist film) used for forming the first and second masks 69 and 67 can be conducted under the condition in that the second inter level dielectric 63 is not exposed. That is, the first film 64 is formed as an underlayer layer in the resist process for forming the second mask 67, and the first film 64 covers the second inter level dielectric 63 in the resist process for forming the first mask 69. Therefore, the restoration treatment of the resist can be conducted without exposing the second inter level dielectric 63, i.e., an organic film, in which the resist films 81 and 83 formed in the resist processes can be removed, and the resist films 81 and 83 are again formed and patterned. Furthermore, because the resist film 83 to be an etching mask for forming the first mask 69 can be removed simultaneously with the etching of the second inter level dielectric 63, the operation of removing the resist film 83 is not necessary. Therefore, the process can be simplified.

In the resist process for forming the via hole pattern 68 for forming the via hole 70 in the first film 64, i.e., in the step of forming the opening 84 in the resist film 83, even when misalignment occurs to form the opening 84 in the resist film 83 deviating from the wiring groove pattern 66 formed in second mask 67, a via hole pattern (not shown in the figure) to be a pattern for forming the via hole also in the second mask 67 can be formed. The detail of this process will be described below with reference to FIGS. 8A to 8F. In each of FIGS. 8A to 8F, a plan view for the arrangement is shown in the upper part, and a cross sectional view is shown in the lower part.

Figure 8A:
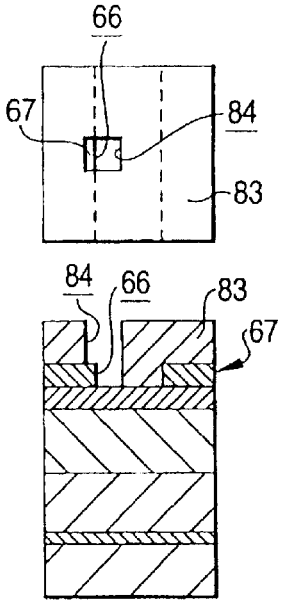
FIGS. 8A to 8F are cross sectional views and plan views showing a process diagram of a fourth embodiment of the process for producing a semiconductor device according to the invention where misalignment occurs.
Figure 8B:
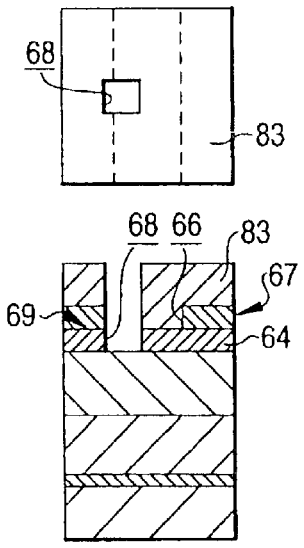

As shown in FIG. 8A, an opening 84 formed in a resist film 83 for forming a via hole pattern is formed deviating from a wiring groove pattern 66 formed in a second mask 67. Even in such a case, by using the resist film 83 as an etching mask, the second mask 67 is etched, and further a first film 64 is etched, to form a via hole pattern 68, so as to form a first mask 69, as shown in FIG. 8B. By this step, the wiring groove pattern 66 and the via hole pattern 68 are formed in the second mask 67.

Figure 8C:
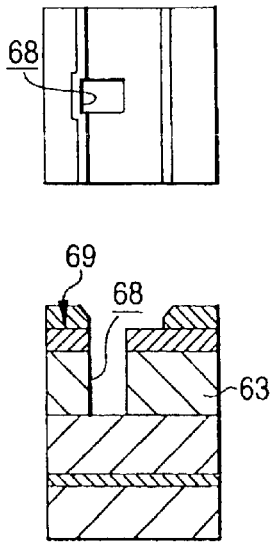

As shown in FIG. 8C, the second inter level dielectric 63 is then etched by using the first mask 69 as an etching mask to form the via hole pattern 68. Therefore, the via hole pattern 68 having the opening area that conforms to its design can be formed. In this etching step, the resist mask 83 (see FIG. 8B) is simultaneously etched and removed.

Figure 8D:
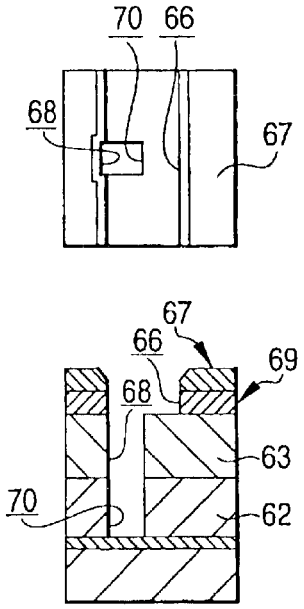

Subsequently, as shown in FIG. 8D, the wiring groove pattern 66 is extended to the first mask 69 by using the second mask 67 as an etching mask. At the same time, the first inter level dielectric 62 is etched by using the second inter level dielectric 63 as an etching mask to form a via hole 70. As a result, because the via hole pattern 68 formed in the second inter level dielectric 63 is formed to have the opening area that conforms to its design, the via hole 70 is formed to have the opening area that conforms to its design.

Figure 8E:
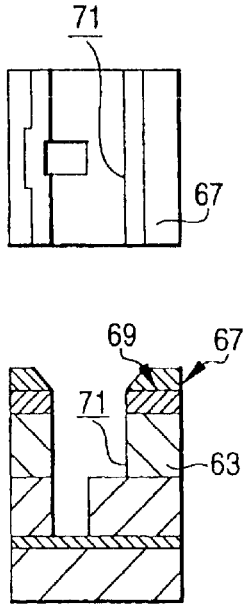
Figure 8F:
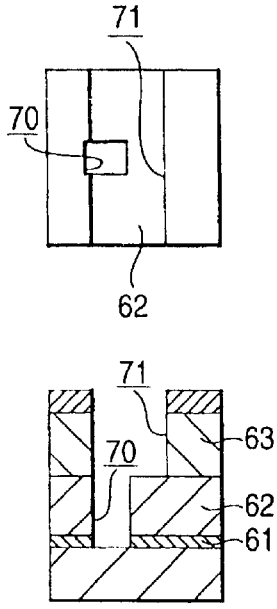

As shown in FIG. 8E, the second inter level dielectric 63 is then etched by using the first mask 69 as an etching mask to form a wiring groove 71. Thereafter, as shown in FIG. 8F, the passivation film 61 exposed at the bottom of the via hole 70 is etched. At this time, the second mask 67 (see FIG. 8E) comprising the same material as the passivation film is also etched and removed. As a result, the wiring groove 71 is formed in the second inter level dielectric 63, and the via hole 70 is formed in the first inter level dielectric 62 and the passivation film 61 as being connected to the bottom of the wiring groove 71. As described in the foregoing, the via hole pattern 68 having an opening area that conforms to its design is formed in the second inter level dielectric 63, and the via hole 70 is not filled with the inter level dielectric after forming the via hole 70. Therefore, the via hole 70 having a narrowed opening area as in the case of FIGS. 2A to 2F is not formed.

In the embodiment described herein, the opening area of the via hole can be ensured even when the via hole pattern deviates from the wiring groove pattern due to misalignment occurring on forming the via hole pattern. However, according to the process for producing a semiconductor device of the invention, the effect of ensuring the opening area of the via hole can be obtained in any case where the wiring groove pattern and the via hole pattern relatively deviate from each other.

Furthermore, the first film 65 to be the first mask 69 is formed with a material having light transmissibility, such as a silicon oxide film used herein, and the second film 65 to be the second mask is formed with a material having light transmissibility, such as a silicon nitride film used herein. Therefore, in the exposure step hereafter, the mask alignment to align the position of the mask to the underlayer can be conducted by alignment using light or alignment using an image processing. It has been known that a silicon oxide film and a silicon nitride film transmit light in the wavelength region of from 200 to 1,000 nm used for alignment.

Moreover, an etching stopper layer having a high dielectric constant (for example, a silicon nitride film, a silicon oxide film or a silicon oxide nitride film), which has been conventionally used, is not necessary by utilizing the difference in characteristics of the materials between the first inter level dielectric 62 and the second inter level dielectric 63. For example, when the condition in that the second inter level dielectric 63 (an organic film) is etched but the first inter level dielectric 62 is not etched is selected, the wiring grooves 71 can be formed in the second inter level dielectric 63 to be a wiring layer with good controllability. When the etching for forming the via holes 70 is conducted, the wiring groove pattern 66 is extended to the first mask 69 comprising a silicon oxide film, and at the same time, the first inter level dielectric 62 comprising a silicon oxide film is etched as described in the foregoing.

According to the invention described in the foregoing, the process comprises the step of forming, on the inter level dielectric, the first mask to be an etching mask for etching the inter level dielectric, and a step of forming, on the first mask, the second mask to be an etching mask for etching the inter level dielectric, the second mask comprising a material different from the first mask. Therefore, the inter level dielectric is etched by using the first mask as an etching mask to form the via holes, and then the inter level dielectric is etched by using the second mask as an etching mask to a pattern different from the first mask, to form the wiring grooves.

Furthermore, according to the production process, in which the upper layer of the inter metal dielectric between the wirings in the same wiring layer is formed with a xerogel film or a fluorine resin film, the wiring capacitance can be reduced. When an organic film or an inorganic film is used only in the inter level dielectric between the wirings layer among the inter level dielectrics, deterioration of the mechanical strength of the whole inter level dielectrics can be suppressed even when the inter level dielectric between the wirings is formed with a xerogel or a fluorine resin. Therefore, a semiconductor device combining copper wiring, a fluorine resin and an organic film, or a semiconductor device combining copper wiring, a xerogel and an organic film can be formed without deterioration of the yield.

In the resist process for forming the second mask, the first film is formed on the underlayer, and in the resist process for forming the first mask, the first film covers the inter level dielectric. Therefore, the resist processes for forming the first and second masks can be conducted under the condition in that the inter level dielectric is not exposed, and thus the restoration treatment of the resist film can be conducted in the resist process.

Even when misalignment occurs on forming the first mask having a pattern for forming the via hole, the pattern for forming the via hole can also be formed in the second mask. Therefore, the narrowing of the opening area of the via hole described in FIGS. 2A to 2F does not occur.

By forming the first mask and the second mask with a material having light transmissibility, the mask alignment in the exposure step of the lithography process conducted after forming the film for forming the first mask and the film for forming the second mask can be conducted in the same alignment method as the conventional process.

What is claimed is:

1. A process for producing a semiconductor device comprising an inter level dielectric comprising a xerogel film or an organic film, said process comprising a step of forming on said inter level dielectric, a first light transmissible mask to be an etching mask for etching said inter level dielectric;

a step of forming, on said first mask, a second light transmissible mask comprising a different material from said first mask to be an etching mask for etching said inter level dielectric, *said second light transmissible mask being formed with a silicon nitride*;

a step of forming, on said second light transmissible mask, a first resist film that is used as a mask for etching said second light transmissible film;

removing said first resist film;

a step of forming, on said first and second light transmissible masks, a second resist film for etching said first light transmissible mask, and first and second levels of said inter level dielectric; *and* removing said second resist film.

2. A process for producing a semiconductor device as claimed in claim 1, wherein a pattern for forming a wiring groove is formed in said second mask, and a pattern for forming a via hole is formed in said first mask in such a manner that said pattern for forming a via hole at least overlaps said pattern for forming a wiring groove.

3. A process for producing a semiconductor device as claimed in claim 2, wherein a method for forming a pattern for forming a wiring groove in said second mask, and forming a pattern for forming a via hole in said first mask in such a manner that said pattern for forming a via hole at least overlaps said pattern for forming a wiring groove comprises a step of forming a first film for forming said first mask on said inter level dielectric, and then forming a second film for forming said second mask on said first film;

a step of forming said pattern for forming a wiring groove in said second film to form said second mask; and a step of forming said pattern for forming a via hole in said first film in such a manner that said pattern for forming a via hole at least overlaps said pattern for forming a wiring groove, to form said first mask.

4. A process for producing a semiconductor device as claimed in claim 1, wherein a lower layer of said inter level dielectric between wiring layers is formed with an organic film, and an upper layer of said inter level dielectric between wiring of the same wiring layer is formed with a xerogel film or an organic film.

5. A process for producing a semiconductor device as claimed in claim 4, wherein a pattern for forming a wiring groove is formed in said second mask, and a pattern for forming a via hole is formed in said first mask in such a manner that said pattern for forming a via hole at least overlaps said pattern for forming a wiring groove.

6. A process for producing a semiconductor device as claimed in claim 5, wherein a method for forming a pattern for forming a wiring groove in said second mask, and forming a pattern for forming a via hole in said first mask in such a manner that said pattern for forming a via hole at least overlaps said pattern for forming a wiring groove comprises a step of forming a first film for forming said first mask on said inter level dielectric, and then forming a second film for forming said second mask on said first film;

a step of forming said pattern for forming a wiring groove in said second film to form said second mask; and a step of forming said pattern for forming a via hole in said first film in such a manner that said pattern for forming a via hole at least overlaps said pattern for forming a wiring groove, to form said first mask.

7. A process for producing a semiconductor device as claimed in claim 6, wherein said process comprises after forming said first mask, a step of continuously etching said inter level dielectric by using a resist film used as an etching mask for forming said first mask and said first mask as an etching mask, to form a via hole; and a step of forming a wiring groove in said first mask and said upper layer of said inter level dielectric by etching using said second mask.

8. A process for producing a semiconductor device as claimed in claim 1, wherein a lower layer of said inter level dielectric between wiring layers is formed with an inorganic film, and an upper layer of said inter level dielectric between wiring of the same wiring layer is formed with an organic film.

9. A process for producing a semiconductor device as claimed in claim 8, wherein a pattern for forming a wiring groove is formed in said second mask, and a pattern for forming a via hole is formed in said first mask in such a manner that said pattern for forming a via hole at least overlaps said pattern for forming a wiring groove.

10. A process for producing a semiconductor device as claimed in claim 9, wherein a method for forming a pattern for forming a wiring groove in said second mask, and forming a pattern for forming a via hole in said first mask in such a manner that said pattern for forming a via hole at least overlaps said pattern for forming a wiring groove comprises step of forming a first film for forming said first mask on said inter level dielectric, and then forming a second film for forming said second mask on said first film;

a step of forming said pattern for forming a wiring groove in said second film to form said second mask; and a step of forming said pattern for forming a via hole in said first film in such a manner that said pattern for forming a via hole at least overlaps said pattern for forming a wiring groove, to form said first mask.

11. A process for producing a semiconductor device as claimed in claim 10, wherein said process comprises after forming said first mask, a step of forming an opening for forming a via hole in said upper layer of said inter level dielectric by using said first mask as an etching mask;

a step of forming an opening for forming a wiring groove in said first mask by etching using said second mask, and forming said via hole in said lower layer of said inter level dielectric by using said upper layer of said inter level dielectric as a mask; and a step of forming said wiring groove in said upper layer of said inter level dielectric by using said second mask as an etching mask.

* * * * *